(12) United States Patent
Arai et al.

(10) Patent No.: US 7,061,772 B2
(45) Date of Patent: Jun. 13, 2006

(54) ELECTRONIC CIRCUIT WITH TRANSMISSION LINE TYPE NOISE FILTER

(75) Inventors: Satoshi Arai, Sendai (JP); Takayuki Inoi, Sendai (JP); Yoshihiko Saiki, Sendai (JP); Sadamu Toita, Sendai (JP)

(73) Assignee: NEC TOKIN Corporation, Sendai (JP)

( * ) Notice: Subject to any disclaimer, the term of this patent is extended or adjusted under 35 U.S.C. 154(b) by 370 days.

(21) Appl. No.: 10/630,481

(22) Filed: Jul. 29, 2003

(65) Prior Publication Data

US 2004/0021534 A1 Feb. 5, 2004

(30) Foreign Application Priority Data

Aug. 5, 2002 (JP) ............................. 2002-227161

(51) Int. Cl.
*H05K 7/02* (2006.01)
*H05K 7/06* (2006.01)
*H05K 7/08* (2006.01)
*H05K 7/10* (2006.01)

(52) U.S. Cl. ...................... 361/783; 361/766; 361/523; 333/181

(58) Field of Classification Search .......... 361/763–76, 361/782–783, 522–525, 306.2, 306.3; 333/180–185
See application file for complete search history.

(56) References Cited

U.S. PATENT DOCUMENTS

| 5,068,631 | A | * | 11/1991 | Vince ........................... 333/181 |
| 5,428,500 | A | * | 6/1995 | Nishiyama et al. .......... 361/525 |
| 5,473,503 | A | * | 12/1995 | Sakata et al. ................ 361/525 |
| 5,488,540 | A | * | 1/1996 | Hatta ........................... 361/794 |
| 5,938,797 | A | * | 8/1999 | Fujiwara et al. ............ 29/25.03 |
| 6,229,688 | B1 | * | 5/2001 | Kobayashi et al. .......... 361/523 |
| 6,327,138 | B1 | * | 12/2001 | Asami et al. ................ 361/523 |
| 6,333,844 | B1 | * | 12/2001 | Nakamura .................... 361/523 |
| 6,762,656 | B1 | * | 7/2004 | Kobayashi et al. .......... 333/184 |

FOREIGN PATENT DOCUMENTS

| JP | 02-097107 A | 4/1990 |
| JP | 03-163812 A | 7/1991 |
| JP | 08-288626 A | 11/1996 |
| JP | 09-180964 A | 7/1997 |
| JP | 10-112574 A | 4/1998 |
| JP | 11-150343 A | 6/1999 |
| JP | 2001-185423 A | 7/2001 |
| JP | 2001-308222 A | 11/2001 |
| JP | 2001-332449 A | 11/2001 |
| JP | 2002-164760 A | 6/2002 |
| WO | WO 01/95424 A1 | 12/2001 |
| WO | WO 02/091515 A1 | 11/2002 |

\* cited by examiner

OTHER PUBLICATIONS

Kubayashi, A. et al "Functional Polymer Tantalum Capacitors" NEC vol. 46 No. 12/1993, Circuit Components Division, pp. 49-55 and 74.

*Primary Examiner*—K. Cuneo
*Assistant Examiner*—Tuan Dinh
(74) *Attorney, Agent, or Firm*—Frishauf, Holtz, Goodman & Chick, P.C.

(57) ABSTRACT

In an electronic circuit having an integrated circuit (110) having a power supply terminal, a noise filter disposed adjacent to the integrated circuit, and a printed board (101) having a pattern for supplying a power supply to the power supply terminals of the integrated circuit through the noise filter, the noise filter consists of a transmission line type noise filter (121–124) for removing noises having a wide frequency band.

7 Claims, 13 Drawing Sheets

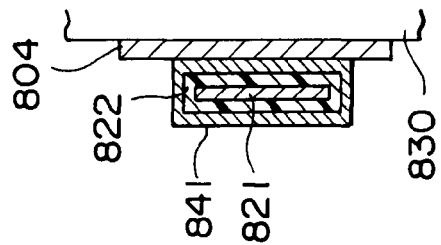
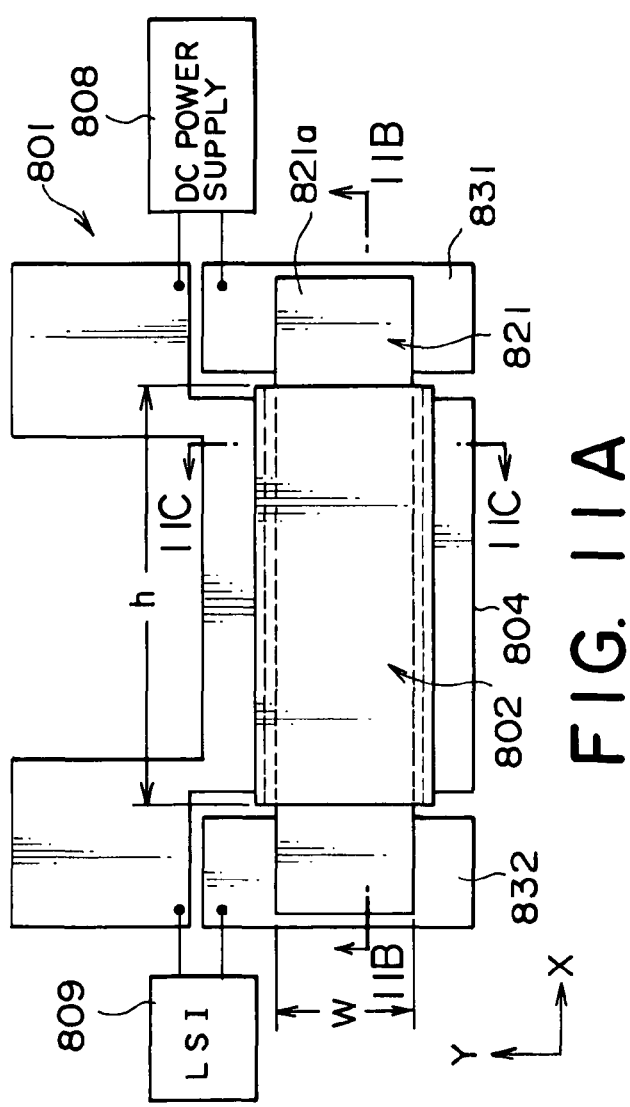
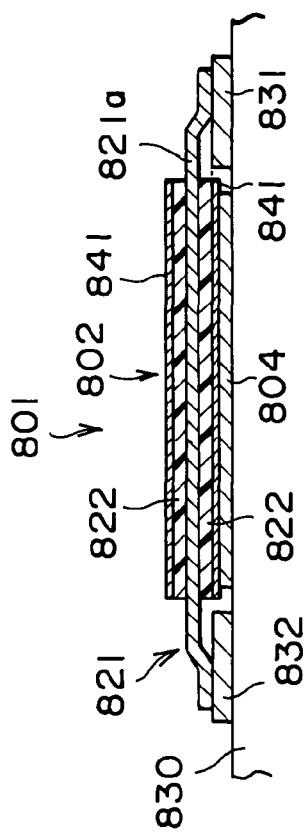

ELECTRONIC CIRCUIT WITH TRANSMISSION LINE TYPE NOISE FILTER

This application claims priority to prior Japanese patent application JP 2002-227161, the disclosure of which is incorporated herein by reference.

BACKGROUND OF THE INVENTION

This invention relates to an electronic circuit and, in particular, to an electronic circuit comprising an integrated circuit having a power supply terminal, a noise filter disposed around the integrated circuit, a printed circuit having a pattern for supply a power supply to the power supply terminal of the integrated circuit through the noise filter.

In recent years, information electronic instruments such as portable telephone sets are widely used in the world. It is well known in the art that technique in digital circuits are used in the information electronic instruments.

The technique of digital circuits are important techniques for supporting an information technology (IT) industry. Recently, the technique of digital circuits such as a large-scale integrated circuit (LSI) is used not only in computers and communication related instruments but also in home electrical appliances and on-vehicle equipment.

When the LSI is operated, it well known in the art that a high frequency current generates on a power supply line of the LSI. The high frequency current dose not stay in the vicinity of the LSI, spreads in a wide area in a mounted circuit board such as a printed circuit board, inductively couples to signal wires or ground wires, and leaks from a signal cable as an electromagnetic wave.

The high frequency current not only causes a malfunction of its own instrument but also has an effect on other instruments and it results in causing electromagnetic compatibility (EMC).

In order to device a countermeasure, to separate the LSI serving as a generating source of a high frequency current from a power supply at a high frequency, namely, a method of power supply decoupling is effective. In prior art, a noise filter such as a bypass capacitor has been used as a decoupling element. Although an operating principle of the power supply decoupling is simple and clear, development of a noise filter having a low impedance coping with a high speed of the LSI falls behind drastically. Specifically, it is difficult to maintain the low impedance up to a high frequency range caused by a self-resonance phenomenon of the capacitor.

Therefore, in a case where removal of electric noises using capacitors is carried out across a wider frequency band, different types of capacitors having different self-resonance frequencies such as an aluminum electrolytic capacitor, a tantalum capacitor, and a ceramic capacitor are disposed in the vicinity of the LSI.

However, a conventional electronic circuit is disadvantageous in that it is troublesome to select a plurality of noise filters used to remove electric noises having a wide frequency band. In addition, the conventional electronic circuit is also disadvantageous in that it has a large mounted area to dispose a plurality of different types of noise filters.

With high speed and high frequency of the LSI, generated noises have a wide band and a high frequency. A high performance noise filter required to remove such noises is desired.

Noise filters for use in a semiconductor device are well known in the art. For example, a noise filter is disclosed, for example, in Japanese Unexamined Patent Publication Tokkai No. 2001-185,423 or JP-A 2001-185423. The noise filter disclosed in JP-A 2001-185423 comprises inductors inserted between respective signal ends and signal lines of the semiconductor device and capacitors connected between respective inductors and the ground.

SUMMARY OF THE INVENTION

It is therefore an object of the present invention to provide an electronic circuit which is capable of stabilizing an operation of an LSI by restraining noises from generated by the LSI by using a transmission line type noise filter having a low impedance up to a high frequency range.

It is another object of the present invention to provide an electronic circuit which is capable of stabilizing an operation of an LSI by restraining noises from generated by the LSI by using a transmission line type noise filter having a small size.

It is still another object of the present invention to provide an electronic circuit which is capable of stabilizing an operation of an LSI by restraining noises from generated by the LSI by using a high performance transmission line type noise filter.

Other objects of this invention will become clear as the description proceeds.

According to an aspect of this invention, an electronic circuit comprises an integrated circuit having a power supply terminal, a transmission line type noise filter, disposed around the integrated circuit, for removing noises having a wide frequency band, and a printed board having a pattern for supplying a power supply to the power supply terminal of the integrated circuit through the transmission line type noise filter.

The transmission line type noise filter may comprise a metal fine wire made of valve-action metal and having a predetermined length, a sintered body formed on the metal fine wire and made of the valve-action metal, a dielectric film formed on a surface of said sintered body, a solid electrolyte layer formed on a surface of said dielectric film, a conductor layer formed on a surface of said solid electrolyte layer, a first and a second anode terminal connected to both ends of the metal fine wire, respectively, and a cathode electrode connected to said conductor layer.

The sintered body may be formed by press-molding power of the valve-action metal, then sintering it at a predetermined temperature or may be formed by winding a green sheet formed from slurry including power of the valve-action metal, around said metal fine wire as a core, then sintering it at a predetermined temperature.

The dielectric film may be made of an oxidized film of said valve-action metal.

The transmission line type noise filter may be an aluminum etched foil type. In this event, the transmission line type noise filter may comprise an aluminum etched foil, an anode oxidized film formed on a predetermined part of said aluminum etched foil, a conductive high molecular compound layer formed on said anode oxidized film, and a graphite and silver paste layer formed on said conductive high molecular compound layer.

BRIEF DESCRIPTION OF THE DRAWING

FIGS. 6A through 6D are diagrams showing a transmission line type noise filter for use in the electronic circuit illustrated in FIG. 1, wherein FIG. 6A is a schematic external perspective view, FIG. 6B is a plan view, and FIGS. 6C and 6D are sectional views taken along line 6C—6C and line 6D—6D of FIG. 6B, respectively;

FIGS. 11A through 11C are diagrams showing still another transmission line type noise filter for use in the electronic circuit illustrated in FIG. 1, wherein FIG. 11A is a plan view, and FIGS. 11B and 11C are sectional views taken along line 11B—11B and line 11C—11C of FIG. 11A, respectively;

DESCRIPTION OF THE PREFERRED EMBODIMENTS

Figure 1:
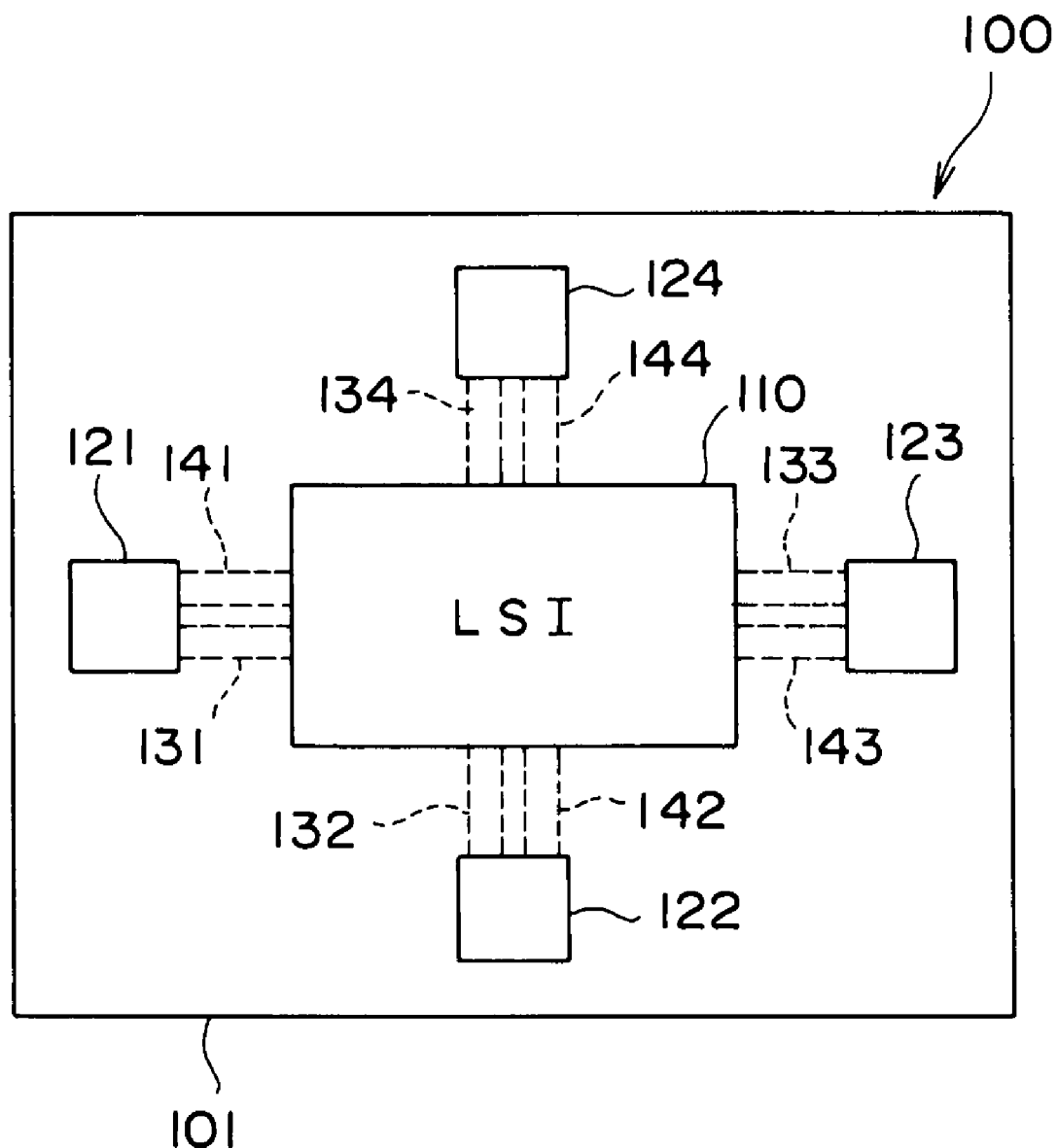
FIG. 1 is a schematic plan view of an electronic circuit according to a first embodiment of this invention.
Figure 2:
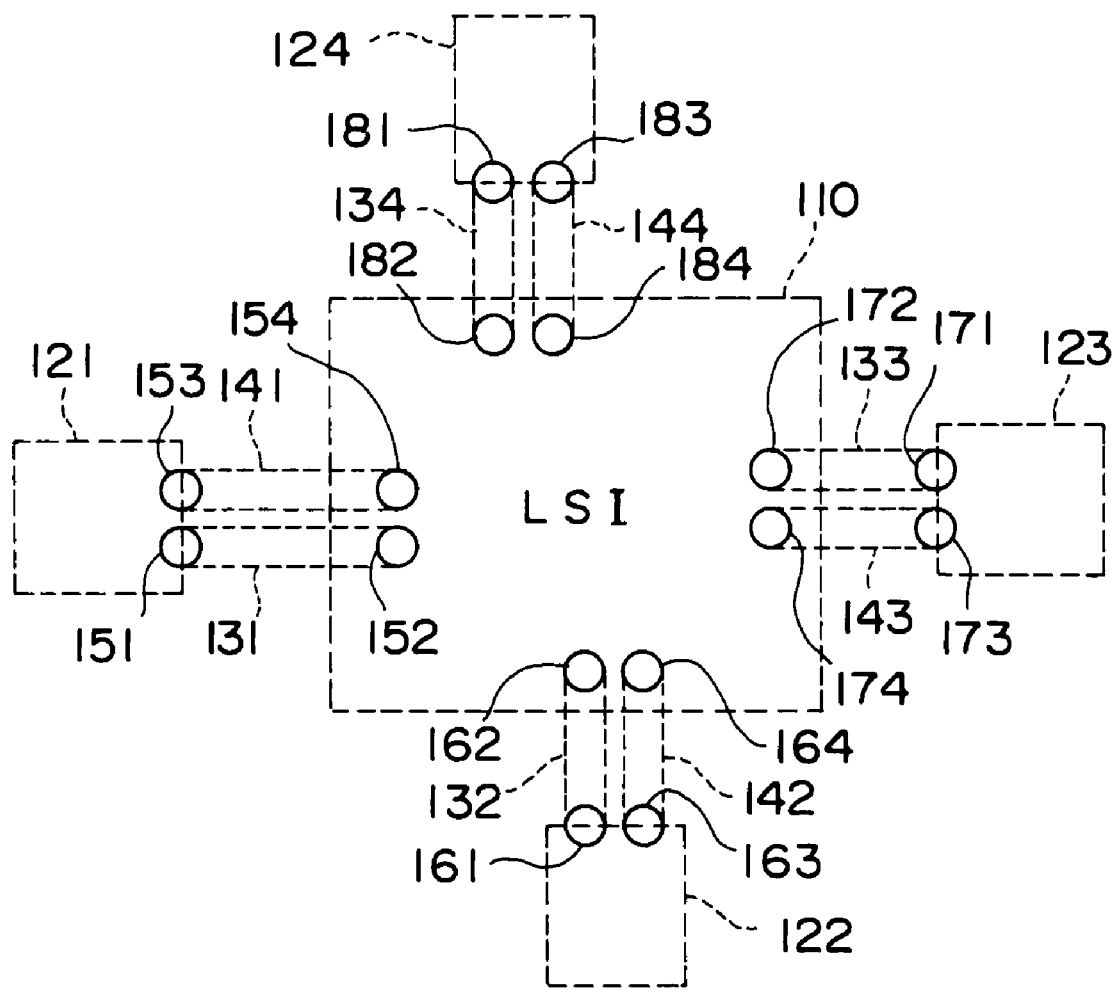
FIG. 2 is a schematic plan view of a mounted surface of a printed board for use in the electronic circuit illustrated in FIG. 1.

Referring to FIGS. 1 and 2, the description will proceed to an electronic circuit 100 according to a first embodiment of this invention. FIG. 1 is a schematic plan view of the electronic circuit 100 according to the first embodiment of this invention. FIG. 2 is a schematic plan view of a mounted surface of a printed board for use in the electronic circuit 100 illustrated in FIG. 1.

The illustrated electronic circuit 100 comprises an integrated circuit 110 having eight power supply terminals 152, 162, 172, 182, 154, 164, 174, and 184, first through fourth transmission line type noise filters 121, 122, 123, and 124, and a printed board 101. In the example being illustrated, the integrated circuit 110 is a large-scale integrated circuit (LSI).

The integrated circuit 110 has first through fourth ground level power supply terminals 152, 162, 172, and 182 and firth through fourth operating voltage level power supply terminals 154, 164, 174, and 184.

The first through the fourth transmission line type noise filters 121–124 are disposed around the integrated circuit 110. Each of the first through the fourth transmission type noise filters 121–124 is for removing noises having a wide frequency band. The first through the fourth transmission type noise filters 121–124 may have the same noise filtering characteristic or may have different noise filtering characteristics. The printed board 101 has first through fourth ground supplying lines 131, 132, 133, and 134 for supplying a ground level power supply to the first through the fourth ground level power supply terminals 152, 162, 172, and 182, respectively, and first through fourth operating voltage supplying lines 141, 142, 143, and 144 for supplying an operating voltage level power supply to the first through the fourth operating voltage level power supply terminals 154, 164, 174, and 184.

The first transmission line type noise filter 121 has a cathode terminal 151 and an anode terminal 153. The second transmission line type noise filter 122 has a cathode terminal 161 and an anode terminal 163. The third transmission line type noise filter 123 has a cathode terminal 171 and an anode terminal 173. The fourth transmission line type noise filter 134 has a cathode terminal 181 and an anode terminal 183.

Figure 3:
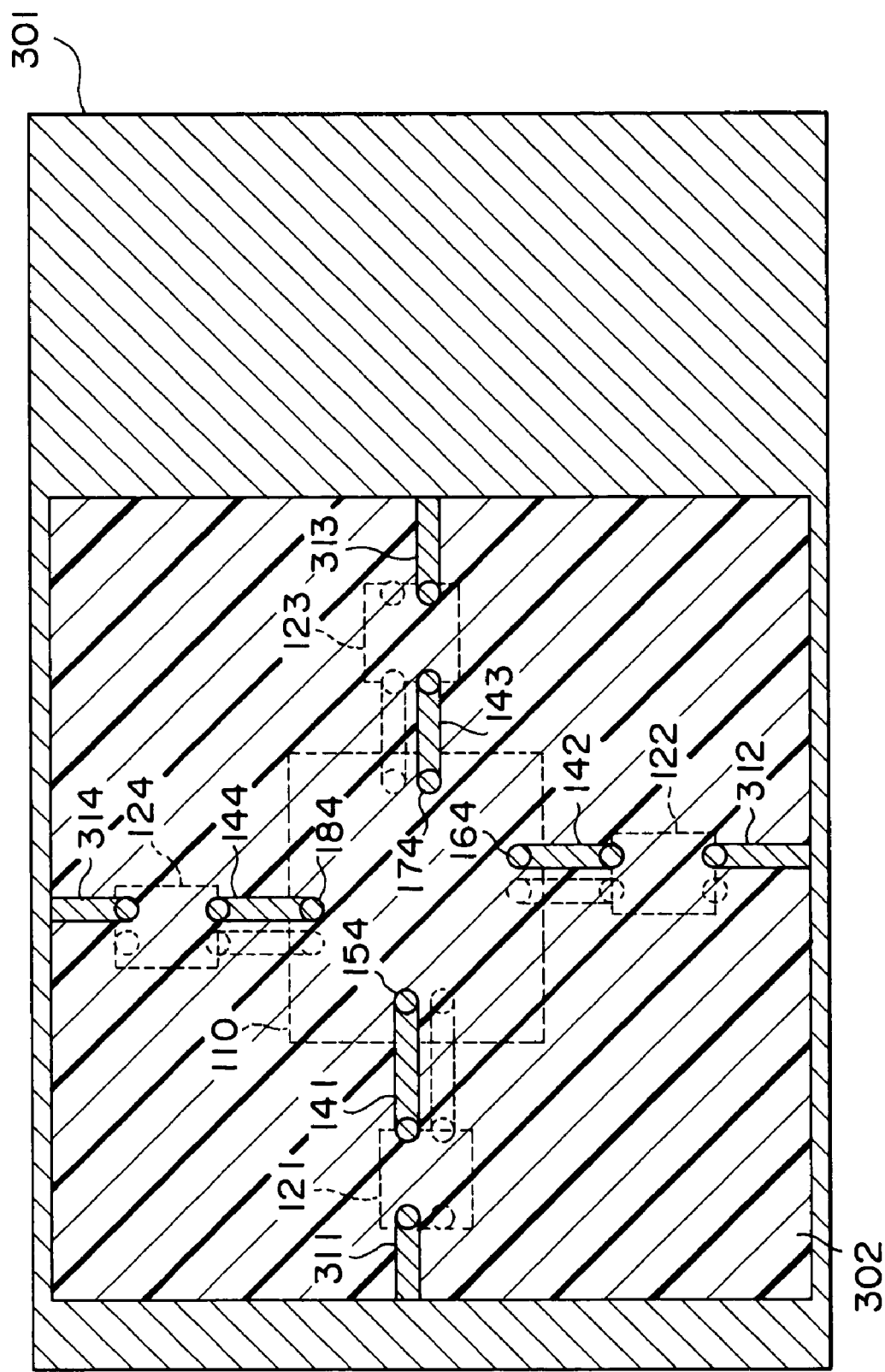
FIG. 3 is a section view of a printed board for use in the electronic circuit illustrated in FIG. 1.

Referring to FIG. 3, the printed board 101 comprises a power supply line layer having a power supply pattern 301 including fifth through eighth operating voltage supplying lines 311, 312, 313, and 314. The power supply pattern 301 is formed on an insulator 302.

Figure 4:
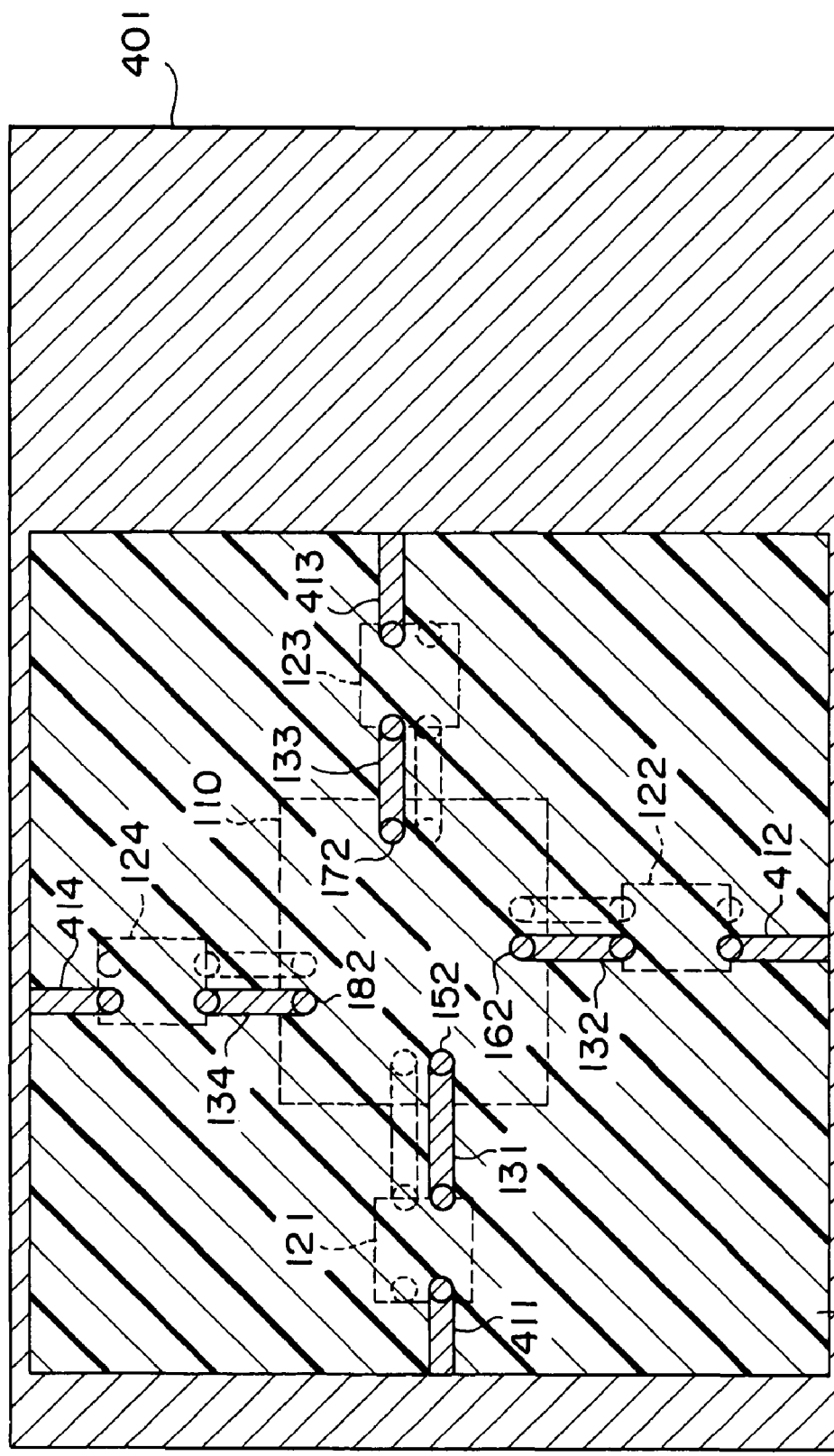
FIG. 4 is a section view of a printed board for use in the electronic circuit illustrated in FIG. 1.

Referring to FIG. 4, the printed board 101 comprises a ground line layer having a ground pattern 401 including fifth through eighth ground supplying lines 411, 412, 413, and 414. The ground pattern 401 is formed on an insulator 402.

Figure 5:
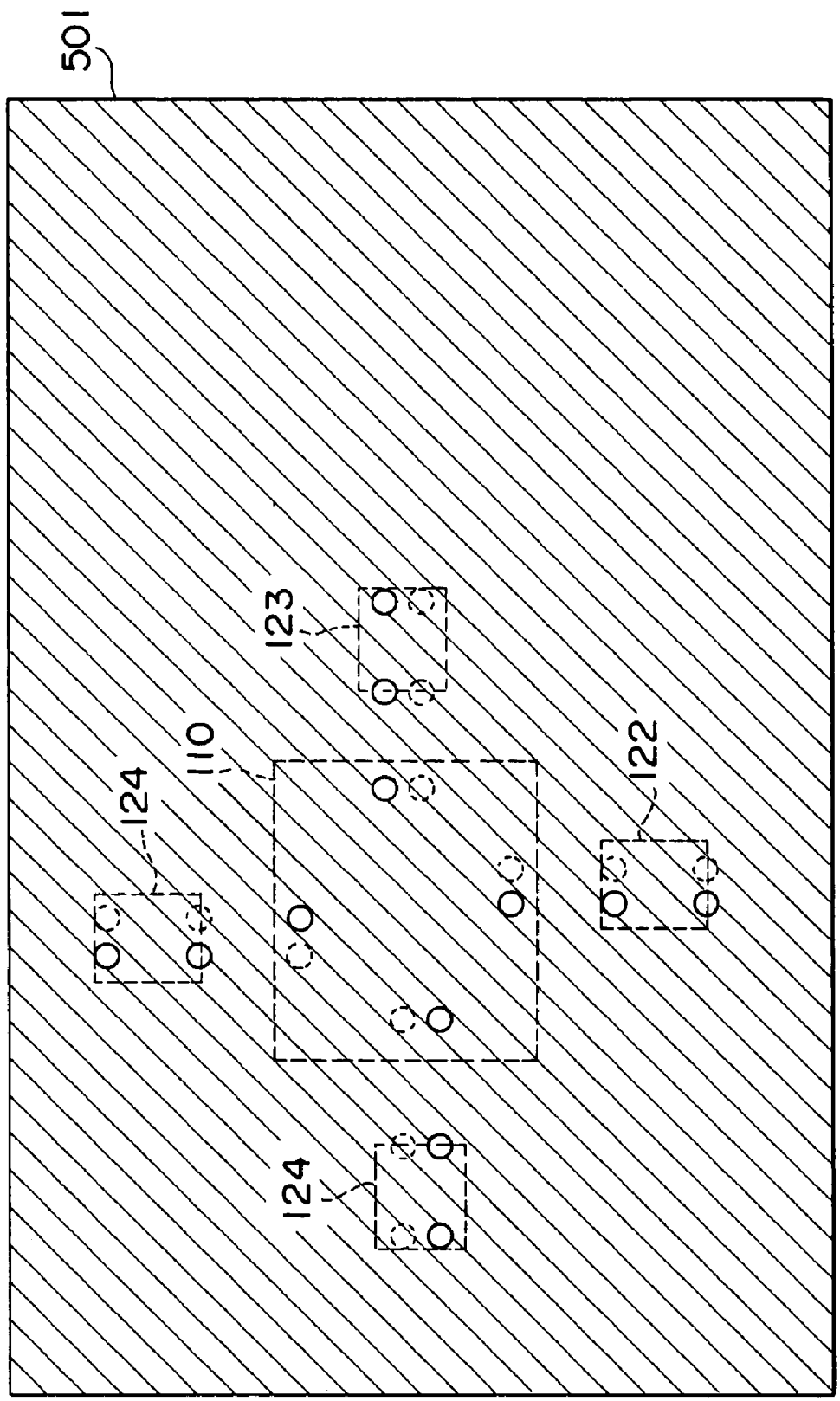
FIG. 5 is a section view of a printed board for use in the electronic circuit illustrated in FIG. 1.
Figure 6A:
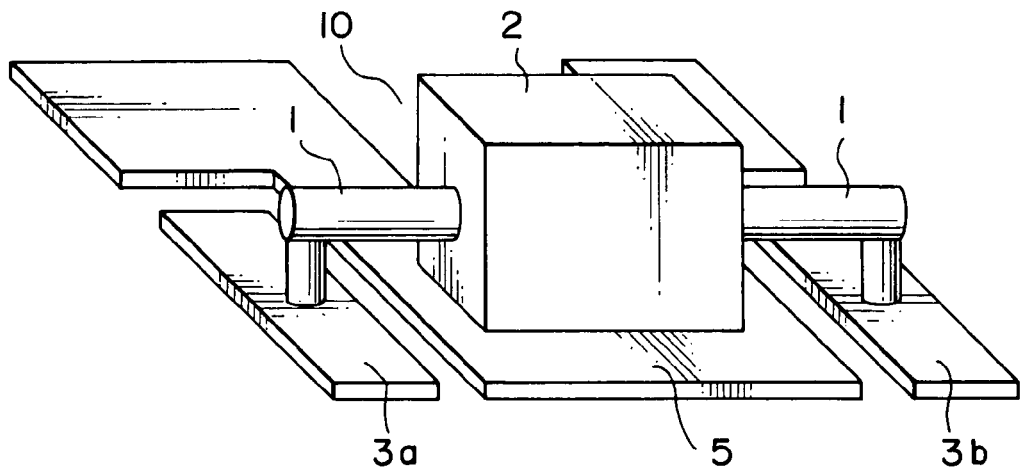
Figure 6B:
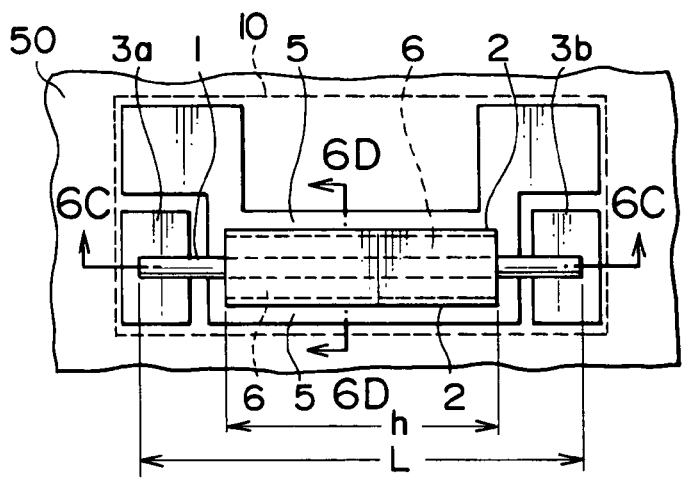
Figure 6D:
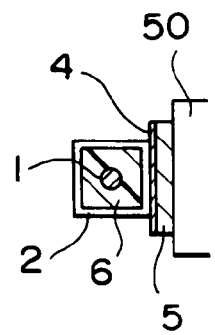
Figure 6C:
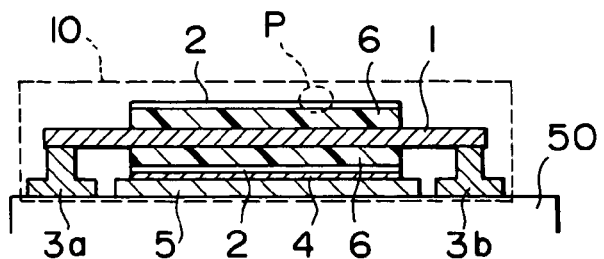

Referring to FIG. 5, the printed board 101 may comprise a ground line layer having an all over ground pattern 501 in place of the ground pattern 401 illustrated in FIG. 4. The all over ground pattern 501 is formed on an insulator (not shown).

As shown in FIG. 1, the first and the third transmission line type noise filters 121 and 123 are laterally disposed in the vicinity of the integrated circuit 110 while the second and the fourth transmission type noise filters 122 and 124 are longitudinally disposed in the vicinity of the integrated circuit 110.

Referring to FIG. 3 again, the first transmission line type noise filter 121 is connected to the first operating voltage level power supply terminal 154 of the integrated circuit 110 through the first operating voltage supplying line 141. The second transmission line type noise filter 122 is connected to the second operating voltage level power supply terminal 164 of the integrated circuit 110 through the second operating voltage supplying line 142. The third transmission line type noise filter 123 is connected to the third operating voltage level power supply terminal 174 of the integrated circuit 110 through the third operating voltage supplying line 143. The fourth transmission line type noise filter 124 is connected to the fourth operating voltage level power supplying terminal 184 of the integrated circuit 110 through the fourth operating voltage supplying line 144.

In addition, the first transmission line type noise filter 121 is connected to the power supply pattern 301 of the printed board through the fifth operating voltage supplying line 311. Likewise, the second transmission line type noise filter 122 is connected to the power supply pattern 301 of the printed board through the sixth operating voltage supplying line 312. The third transmission line type noise filter 123 is connected to the power supply pattern 301 of the printed board through the seventh operating voltage supplying line 313. The fourth transmission line noise filter 124 is connected to the power supply pattern 301 of the printed board through the eighth operating voltage supplying line 314.

Referring to FIG. 4 again, the first transmission line type noise filter 121 is connected to the first ground level power supply terminal 152 of the integrated circuit 110 through the first ground supplying line 131. Similarly, the second transmission line type noise filter 122 is connected to the second ground level power supply terminal 162 of the integrated circuit 110 through the second ground supplying line 132. The third transmission line type noise filter 123 is connected to the third ground level power supply terminal 172 of the integrated circuit 110 through the third ground supplying line 133. The fourth transmission line type noise filter 124 is connected to the fourth ground level power supply terminal 182 of the integrated circuit 110 through the fourth ground supplying line 134.

In addition, the first transmission line type noise filter 121 is connected to the ground pattern 401 of the printed board through the fifth ground supplying line 411. Likewise, the second transmission line type noise filter 122 is connected to the ground pattern 401 of the printed board through the sixth ground supplying line 412. The third transmission line type noise filter 123 is connected to the ground pattern 401 of the printed board through the seventh ground supplying line 413. The fourth transmission line type noise filter 124 is connected to the ground pattern 401 of the printed board through the eighth ground supplying line 414.

Referring to FIGS. 6A through 6D, the description will proceed to a transmission line type noise filter 10 for use in the electronic circuit according to the embodiment of this invention. The illustrated transmission line type noise filter 10 is mounted on electrodes (not shown) of a mounting board 50.

The transmission line type noise filter 10 comprises a tantalum fine wire 1, a conductor layer 2, a first anode terminal 3a, a second anode terminal 3b, a cathode terminal 5, and a capacitance forming portion 6. The tantalum fine wire 1 consists of a valve-action metal fine wire and has a predetermined length L. The conductor layer 2 has a length h and is formed so as to cover the periphery of a center portion of the tantalum fine wire 1. The first and the second anode terminals 3a and 3b are connected to both ends of the tantalum fine wire 1, respectively. The cathode terminal 5 is connected to the conductor layer 2 using a conductive adhesive 4 such as silver paste. The capacitance forming portion 6 is disposed between the tantalum fine wire 1 and the conductor layer 2.

In the present invention, valve-action metal represents such metal in which, when oxidized, an oxidized film thereof performs a valve action.

The first anode terminal 3a is connected to the operating voltage supplying line such as 141–144 in FIG. 3. The cathode terminal 5 is connected to the ground supplying line such as 131–134 in FIG. 4. The second anode terminal 3b is connected to the power supply pattern 301 in FIG. 3. The cathode terminal 5 is connected to the ground pattern 401 in FIG. 4.

Figure 7:
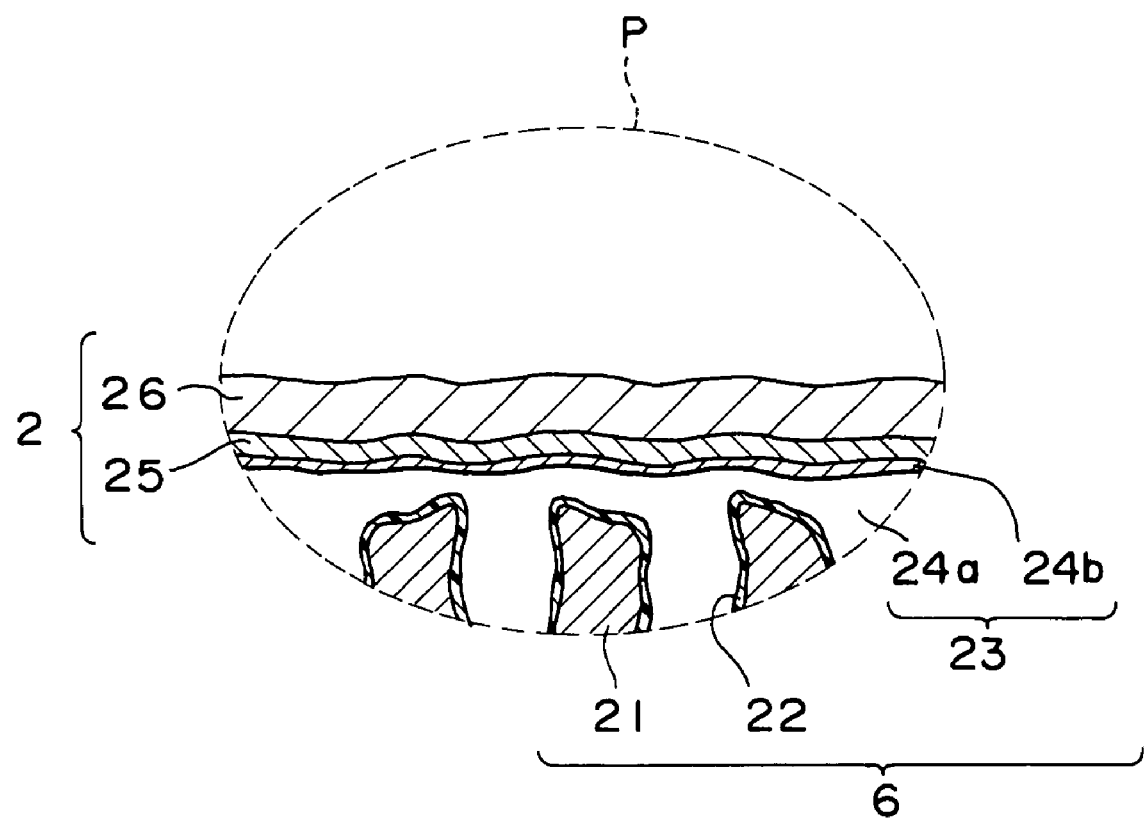
FIG. 7 is a schematic enlarged view of a portion P of the transmission line type noise filter illustrated in FIGS. 6A through 6D.

Referring to FIG. 7, the capacitance forming portion 6 comprises a tantalum sintered body 21, an oxidized tantalum film 22, and a solid electrolyte layer 23. The tantalum sintered body 21 is formed around the central portion of the tantalum fine wire 1 so as to be integral with the tantalum fine wire 1. The oxidized tantalum film 22 consists of a dielectric film formed by oxidizing the surface of the tantalum sintered body 21. The solid electrolyte layer 23 is formed on the oxidized tantalum film 22. The capacitance forming portion 6 forms a solid electrolytic capacitance with the tantalum sintered body 21 and the solid electrolyte layer 23 serving as an anode and a cathode, respectively.

The conductor layer 2 comprises a graphite layer 25 and a silver coating layer 26. The graphite layer 25 is formed on the surface of the solid electrolyte layer 23. The silver coating layer 26 is formed on the surface of the graphite layer 25. The cathode terminal 5 is connected to the silver coating layer 26 using the conductive adhesive 4.

In the example being illustrated, the solid electrolyte layer 23 is composed of two layers, i.e. a first conductive high molecular compound layer 24a and a second conductive high molecular compound layer 24b. The first conductive high molecular compound layer 24a directly contacts the oxidized tantalum film 22. The second conductive high molecular compound layer 24b is formed on the first conductive high molecular compound layer 24a.

The length h of the conductor layer 2 and the size of a section of the conductor layer 2 perpendicular to a longitudinal direction of the tantalum fine wire 1 may be suitably determined depending on desired characteristics of the noise filter.

For the solid electrolyte layer 23, a conductive high molecular compound can be used that includes a monomer of a ring organic compound such as pyrrole, aniline, thiophene or furan, or a polymer of a derivative thereof. A layer of the conductive high molecular compound can be formed on the surface of the oxidized tantalum film 22 through chemical oxidative polymerization.

When forming the solid electrolyte layer 23 by a plurality of layers, such as two layers, of conductive high molecular compounds, a two-layer structure can be achieved by selection from the foregoing conductive high molecular compounds (duplicate selection of the same material is also possible). In this event, at least the conductive high molecular compound layer that directly contacts the surface of the oxidized tantalum film 22 is formed through chemical oxidative polymerization.

The transmission line type noise filter 10 for use in the electronic circuit according to this embodiment constitutes a transmission line of a coaxial-line type which has the tantalum fine wire 1 serving as a central conductor and the conductor layer 2 serving as an external conductor. Further, inasmuch as the extremely large capacitance excellent in frequency characteristic can be added between the tantalum fine wire 1 and the cathode terminal 5, the impedance is held to very low over the wide frequency range and it is possible to constitute a nose filter having a low impedance characteristic over the wide frequency range.

In the manner which is described above, the transmission line type noise filter for use in the electronic circuit of this invention forms a transmission line having a low impedance that comprises the central conductor consisting of the metal fine wire made of the valve-action metal such as tantalum and the dielectric layer consisting of the oxidized film of a sintered body made of valve-action metal powder similar to the central conductor and constitutes the noise filter having an excellent noise removal performance over the wide frequency range.

While this invention has thus far been described in conjunction with a preferred embodiment thereof, it is to be understood that modifications will be apparent to those skilled in the art without departing from the sprit of the invention. For example, a high frequency filer may be selected as the transmission line type noise filter. Although tantalum is used as the valve-action metal for the transmission line type noise filter, niobium (Nb) may be used as the valve-action metal.

Now, a manufacturing method of the transmission line type noise filter 10 will be described.

Figure 8:
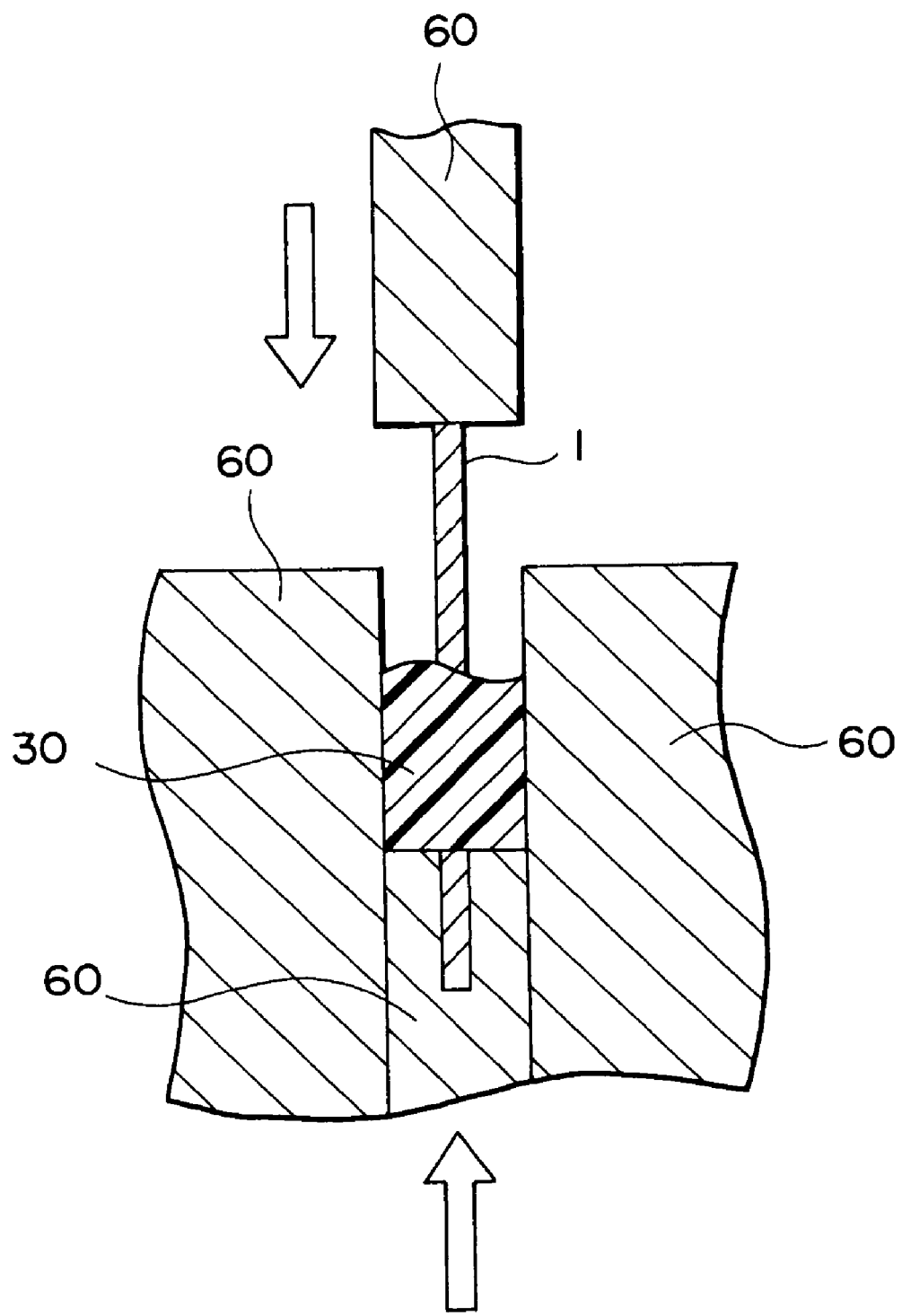
FIG. 8 is a diagram for explaining a manufacturing method of the transmission line type noise filter illustrated in FIGS. 6A through 6D, which is manufactured using press molding of tantalum powder.

First, a binder that volatilizes at a predetermined temperature is mixed into tantalum powder 30 being porous metal powder around the central portion, in a longitudinal direction (hereinafter referred to as "first direction"), of the rectilinear tantalum fine wire 1 having the predetermined length L, then the mixture is press-molded by a die 60 as shown in FIG. 8, for example, so as to have the length h in the first direction.

Subsequently, this press-method mixture is sintered in a vacuum at the predetermined temperature, thereby to obtain a tantalum sintered body (not shown). The binder volatilizes during sintering, and the residual tantalum sintered body is porous.

Subsequently, this tantalum sintered body is immersed into a phosphoric acid liquid and, while applying a positive voltage to the tantalum sintered body and a negative voltage to the phosphoric acid liquid to control a thickness thereof, the surface of the tantalum sintered body is oxidized, thereby forming the oxidized tantalum film (dielectric) 22 having a desired thickness.

Subsequently, the solid electrolyte layer 23 is formed on the surface of the oxidized tantalum film 22. Specifically, first, a polypyrrole layer, for example, is formed on the surface of the oxidized tantalum film 22 as the first conductive high molecular compound layer 24a through chemical oxidative polymerization, then a polypyrrole layer including conductive powder, for example, is formed on the first conductive high molecular compound layer 24a as the second conductive high molecular compound layer 24b through chemical oxidative polymerization or electrolytic oxidative polymerization.

Subsequently, the graphite layer 25 and the silver coating layer 26 are formed on the second conductive high molecular compound layer 24b in a stacked manner for drawing out a cathode-side electrode. Thereafter, the first anode terminal 3a is welded to one end of the exposed tantalum fine wire 1 and the second anode terminal 3b is welded to the other end thereof, and the cathode terminal 5 and the silver coating layer 26 are bonded together using the conductive adhesive 4, then the composite is packaged using, for example, epoxy resin (not shown), thereby completing the transmission line type noise filter 10 as an electronic element.

In the present invention, the valve-action metal is not limited to tantalum, and niobium (Nb) may also be used.

Figure 9A:
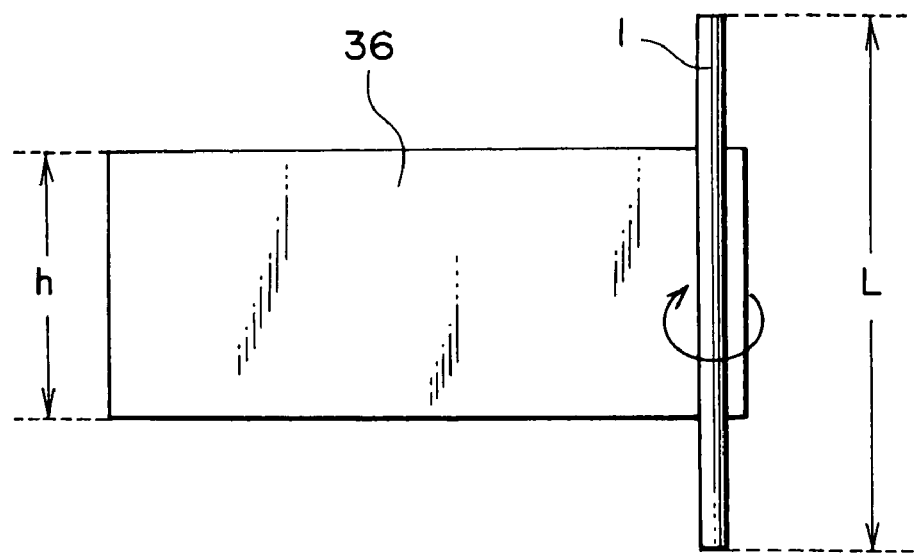
FIGS. 9A and 9B are diagrams for explaining another manufacturing method of the transmission line type noise filter illustrated in FIGS. 6A through 6D, which is manufactured using a green sheet.
Figure 9B:
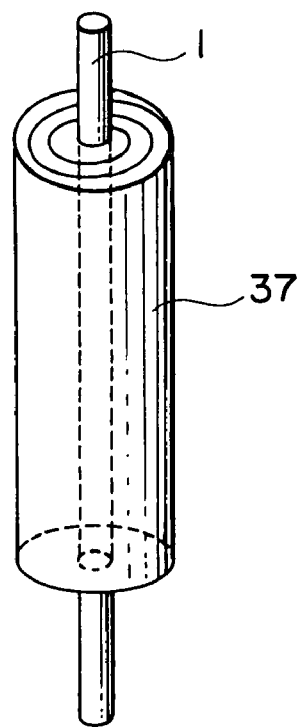

In the present invention, a manufacturing method as shown In FIGS. 9A and 9B can also be used with respect to a sintered body, other than the manufacturing method as described above using FIG. 8. Specifically, a green sheet 36 having a predetermined width h and the thickness is formed from slurry including tantalum powder being porous metal powder and a binder that volatilizes at a predetermined temperature. Then, using a tantalum fine wire 1 having a predetermined length L (L>h) as a core, the green sheet 36 is wound around a central portion thereof a predetermined number of times, exposing both end portions of the tantalum fine wire 1.

Subsequently, it is sintered in a vacuum at the predetermined temperature so as to obtain a sintered wound body 37. The binder volatilizes during sintering, and the residual sintered wound body 37 is porous.

Subsequently, the sintered wound body 37 is immersed into a phosphric acid liwuid and, while applying a positive volatage to the sintered wound body 37 and a negative voltage to the phosphoric acid liquid to control a thickness thereof, the surface of the sintered wound body 37 is oxidized, thereby forming an oxidized tantalum film (dielectric) having a desired thickness. Thereafter, the same processes as those in the first embodiment will be carried out.

Also in case of this configuration and manufacturing method, niobium powder may be used instead of tantalum powder.

Figure 10:
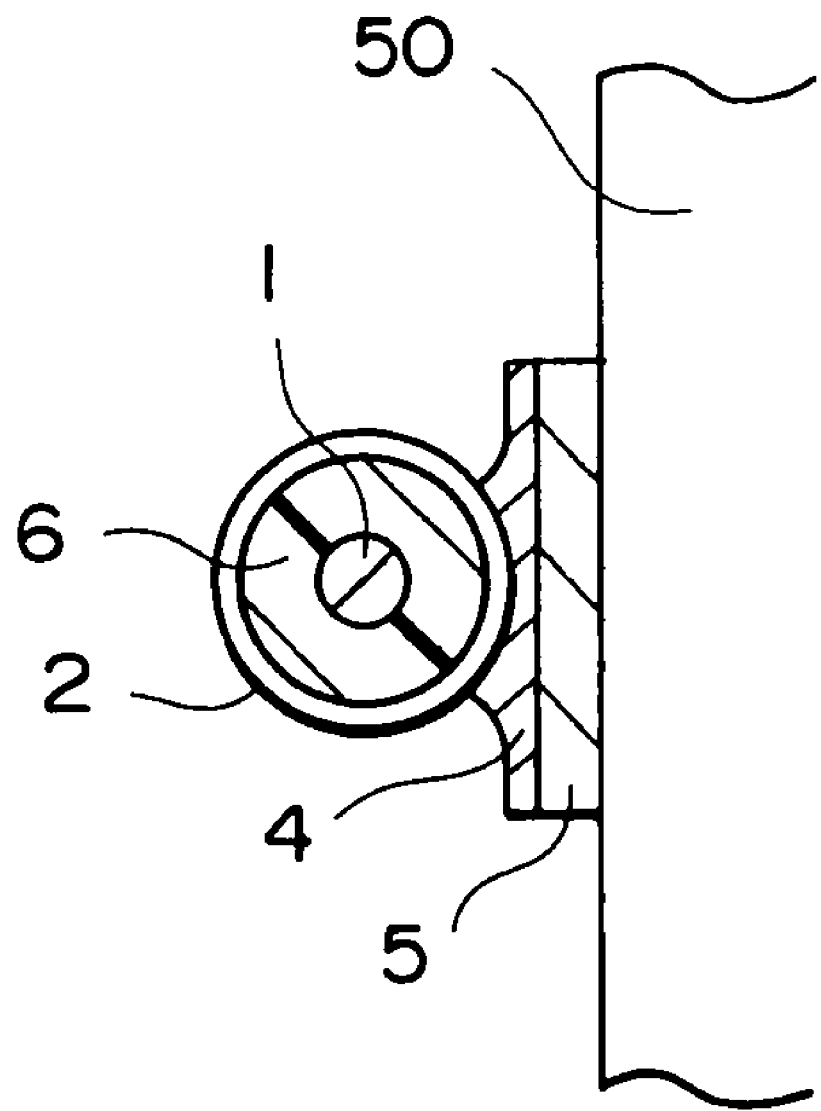
FIG. 10 is an exemplary sectional view, corresponding to FIG. 6D, of another transmission line type noise filter, which has a conductor layer whose external shape is cylindrical.

In the present invention, the external shape of the conductor layer 2 is not limited to a prismatic shape, i.e. a section of the conductor layer 2 perpendicular to the longitudinal direction of the tantalum fine wire 1 is not limited to a rectangular shape. Specifically, as shown in FIG. 10, the external shape may be cylindrical, i.e. a section of a conductor layer 2 and a capacitance forming portion 6 perpendicular to the longitudinal direction of the tantalum fine wire 1 may have a circular shape. Incidentally, FIG. 10 is a diagram corresponding to FIG. 6D when the conductor layer 2 and the capacitance forming portion 6 are cylindrical in shape.

Referring to FIGS. 11A through 11C, the description will proceed to another transmission line type noise filter 801 for use in the electronic circuit according to the embodiment of this invention. The illustrated transmission line type noise filter 801 is mounted on electrodes (not shown) of a mounting board 830.

The illustrated transmission line type noise filter 801 comprises a distributed constant circuit forming portion 802 having a rectangular parallelopiped shape and a pair of electrode portions 821a projecting from the distributed constant circuit forming portion 802 in a longitudinal direction thereof. The distributed constant circuit forming portion 802 comprises a metal plate 821 having a substantial flat plate shape, an opposite metal layer 841, and two dielectrics 822 disposed between the metal plate 821 and the opposite metal layer 841. That is, the distributed constant circuit forming portion 802 has a transmission line structure called a strip line.

The metal plate 821 has portions projected from both ends of the distributed constant circuit forming portion 802 that serve the electrode portions 821a. A distributed constant type noise filter having such a structure acts as a noise filter having a wide frequency band by connecting the both electrode portions 821a with a power supply and a load circuit, respectively, and by connecting the opposite metal layer 841 with a fixed potential such as a ground potential in the manner which will later be described.

The transmission line type noise filter 801 for use in the electronic circuit of this invention is mounted on the mounting board 830 which is connected to the power supply and electronic parts. More specifically, the both electrode portions 821a of the noise filter 801 are connected, on the mounting board 830, to a power supply terminal 831 and a part terminal 832, respectively. The power supply terminal 831 is connected to a DC power supply 808 while the part terminal 832 is connected to an electronic part 809 such as LSI (large-scale integrated circuit). In addition, the mounting board 830 is provided with an electrode terminal 804 for making the opposite metal layer 841 of the distributed constant circuit forming portion 802 the fixed potential such as the ground potential.

Figure 12:
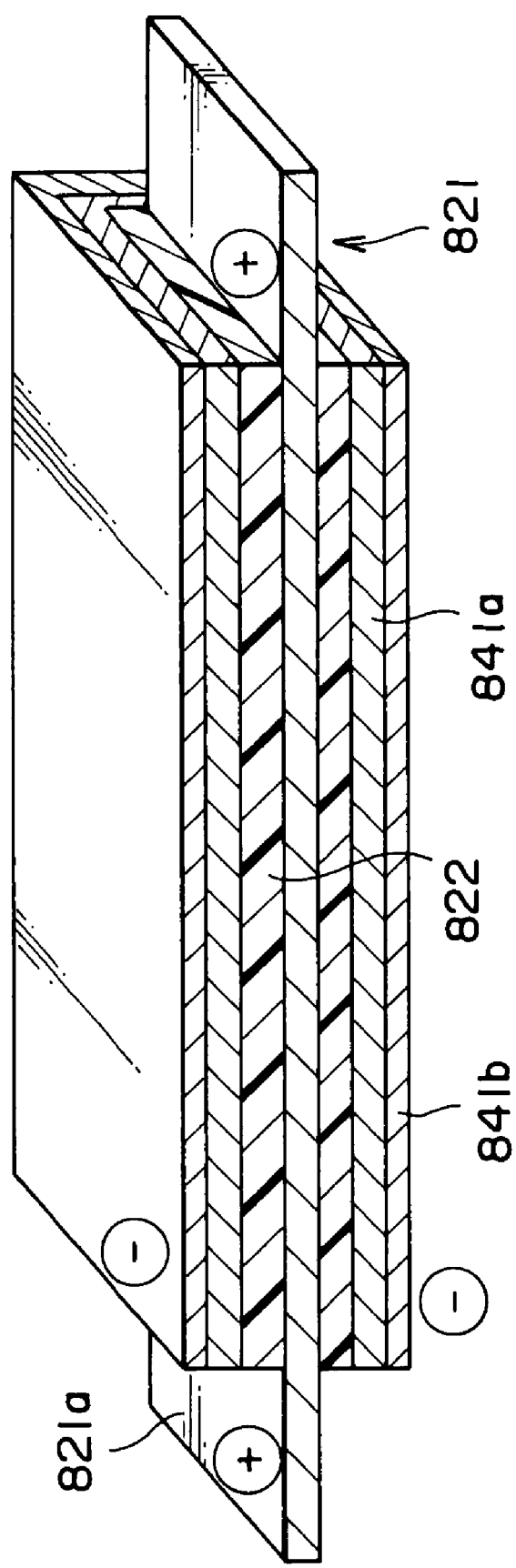
FIG. 12 is a schematic perspective view of an aluminum solid electrolytic capacitor used as the noise filter illustrated in FIGS. 11A through 11C.

FIG. 12 shows an example of the noise filter illustrated in FIGS. 11A through 11C. The noise filter illustrated in FIG. 12 comprises an aluminum foil 821, an oxidized film 822, a solid electrolyte layer 841a, and a graphite and silver paste layer 841b. The aluminum foil 821 has an uneven surface subjected to etching processing. The oxidized film 822 is formed along the uneven surface of the aluminum foil 821 as the dielectrics. The solid electrolyte layer 841a is formed on a surface of the oxidized film 822. The solid electrolyte layer 841a may be a conductive high molecular compound layer. The graphite and silver paste layer 841b is formed on the solid electrolyte layer 841a.

This structure is a strip line structure similar to the noise filter illustrated in FIGS. 11A through 11C. That is, a line conductor corresponds to the aluminum foil 821 at a center and a dielectric corresponds to an etched layer where the oxidized film 822 is formed. In addition, a ground conductor corresponds to the solid electrolyte layer 841a and the graphite and silver paste layer 841b. Inasmuch as the etched layer is subjected to a processing so as to make a surface area larger, it is possible to obtain a larger electrostatic capacitance compared with a ceramic capacitor made of a single material and the etched layer is suitable to the distributed constant type noise filter.

Figure 13:
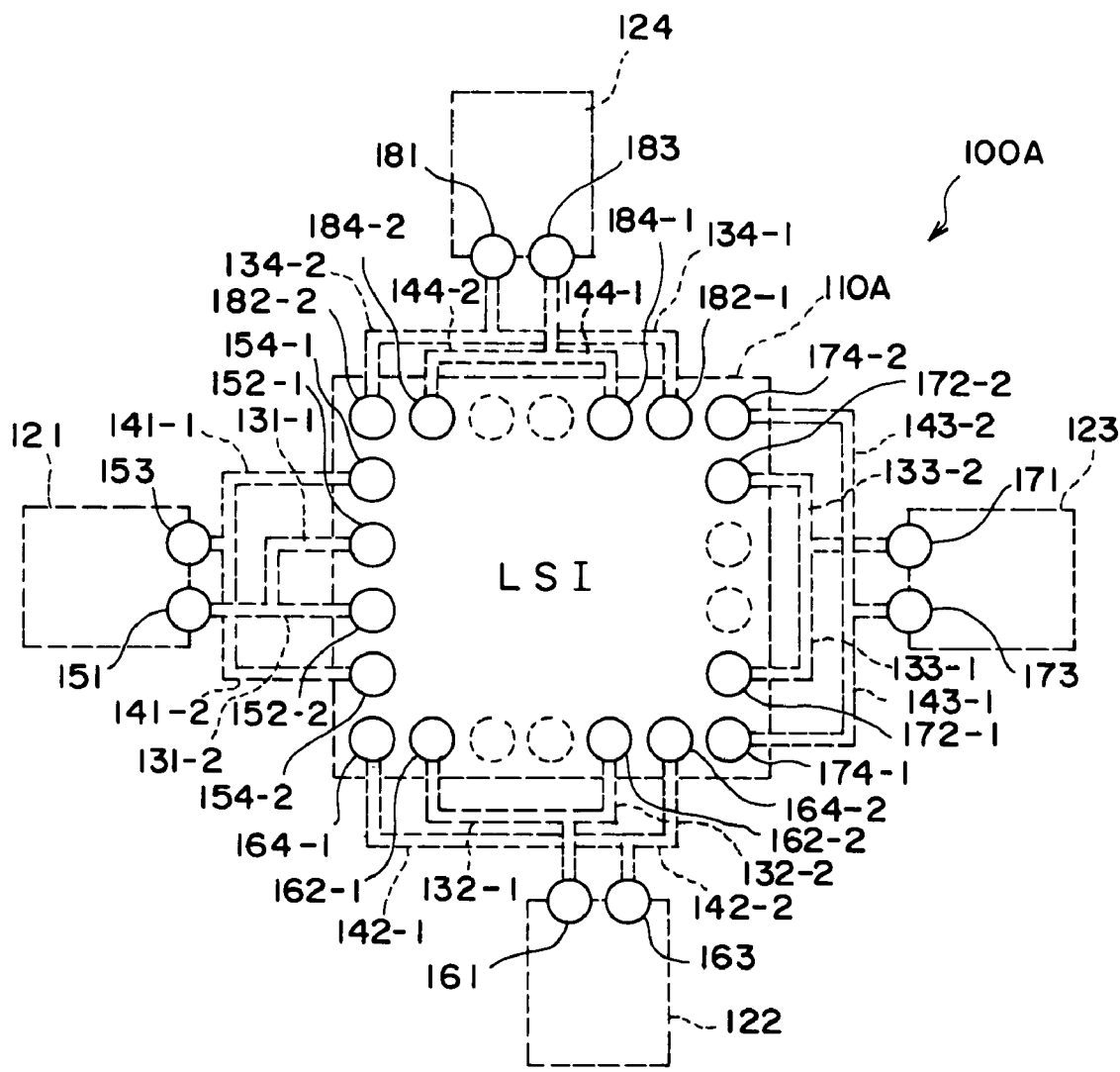
FIG. 13 is a schematic plan view of a mounted surface of a printed board for use in an electronic circuit according to a second embodiment of this invention.

Referring to FIG. 13, the description will proceed to an electronic circuit 100A according to a second embodiment of this invention. FIG. 13 is a schematic plan view of a mounted surface of a printed board for use in the electronic circuit 100A.

The illustrated electronic circuit 100A comprises an integrated circuit 110A having sixteen power supply terminals 152-1, 152-2, 162-1, 162-2, 172-1, 172-2, 182-1, 182-2, 154-1, 154-2, 164-1, 164-2, 174-1, 174-2, 184-1, and 1842, first through fourth transmission line type noise filters 121, 122, 123, and 124, and a printed board (not shown). In the example being illustrated, the integrated circuit 110A is a large-scale integrated circuit (LSI).

The integrated circuit 110A has first through eighth ground level power supply terminals 152-1, 152-2, 162-1, 162-2, 172-1, 172-2, 182-1, and 182-2 and firth through eighth operating voltage level power supply terminals 154-1, 154-2, 164-1, 164-2, 174-1, 174-2, 184-1, and 184-2. That is, the integrated circuit 110 has eight power supply terminals.

The first through the fourth transmission line type noise filters 121–124 are disposed around the integrated circuit 110A. Each of the first through the fourth transmission type noise filters 121–124 is for removing noises having a wide frequency band. The first through the fourth transmission line type noise filters 121–124 may have the same noise filtering characteristic or may have different noise filtering characteristics. The printed board has first through eighth ground supplying lines 131-1, 131-2, 132-1, 132-2, 133-1, 133-2, 134-1, and 134-2 for supplying a ground level power supply to the first through the eighth ground level power supply terminals 152-1, 152-2, 162-1, 162-2, 172-1, 172-2, 182-1, and 182-2, respectively, and first through eighth operating voltage supplying lines 141-1, 141-2, 142-1, 142-2, 143-1, 143-2, 144-1, and 144-2 for supplying an operating voltage level power supply to the first through the eighth operating voltage level power supply terminals 154-1, 154-2, 164-1, 164-2, 174-1, 174-2, 184-1, and 184-2, respectively.

As shown in FIG. 13, the first and the third transmission line type noise filters 121 and 123 are laterally disposed around the integrated circuit 110A while the second and the fourth transmission type noise filters 122 and 124 are longitudinally disposed around the integrated circuit 110A.

The first transmission line type noise filter 121 is connected to the first and the second operating voltage level power supply terminals 154-1 and 154-2 of the integrated circuit 11A through the first and the second operating voltage supplying lines 141-1 and 141-2, respectively. The second transmission line type noise filter 122 is connected to the third and the fourth operating voltage level power supply terminals 164-1 and 164-2 of the integrated circuit 110A through the third and the fourth operating voltage supplying lines 142-1 and 142-2, respectively. The third transmission line type noise filter 123 is connected to the fifth and the sixth operating voltage level power supply terminals 174-1 and 174-2 of the integrated circuit 110A through the fifth and the sixth operating voltage supplying lines 143-1 and 143-2, respectively. The fourth transmission line type noise filter 124 is connected to the seventh and the eighth operating voltage level power supplying terminals 184-1 and 184-2 of the integrated circuit 11A through the seventh and the eighth operating voltage supplying lines 144-1 and 144-2.

The first transmission line type noise filter 121 is connected to the first and the second ground level power supply terminals 152-1 and 152-2 of the integrated circuit 110A through the first and the second ground supplying lines 131-1 and 131-2, respectively. Similarly, the second transmission line type noise filter 122 is connected to the third and the fourth ground level power supply terminal 162-1 and 162-2 of the integrated circuit 110A through the third and the fourth ground supplying lines 132-1 and 132-2, respectively. The third transmission line type noise filter 123 is connected to the fifth and the sixth ground level power supply terminals 172-1 and 172-2 of the integrated circuit 110A through the fifth and the sixth ground supplying lines 133-1 and 133-2, respectively. The fourth transmission line type noise filter 124 is connected to the seventh and the eighth ground level power supply terminals 182-1 and 182-2 of the integrated circuit 110A through the seventh and the eighth ground supplying lines 134-1 and 134-2, respectively.

In the manner which is described above, each of the first through the fourth transmission line type noise filters 121–124 is connected to four power supply terminals of the integrated circuit 110A.

While this invention has thus far been described in conjunction with the embodiments thereof, it will readily be possible for those skilled in the art to put the present invention into practice other manners without departing from the sprit of the invention. For example, although the electronic circuit comprises four transmission line type noise filters in the above-mentioned embodiments, the electronic circuit may comprises at least only transmission line type noise filter. In addition, although the integrated circuit has eight or sixteen power supply terminals in the above-mentioned embodiments, the integrated circuit may have at least one power supply terminal.

What is claimed is:

1. An electronic circuit comprising:
   an integrated circuit having a power supply terminal;
   a transmission line type noise filter disposed adjacent to the integrated circuit for removing noise in a wide frequency range; and
   a printed board having a pattern through which power is supplied to the power supply terminal of the integrated circuit through the transmission line type noise filter;
   wherein the transmission line type noise filter comprises:
      an anode member comprising a valve-action metal;
      a dielectric film comprising an oxidized film of the valve-action metal;
      a conductive layer including a solid electrolyte layer as a cathode disposed over the dielectric film; and
      first and second anode terminals at respective ends of the anode member;
   wherein the printed board comprises a power line layer having a power supply pattern which includes a first power supply line and a second power supply line which are electrically separated, and wherein the power line layer is provided in a different plane from a mounting surface of the transmission line type noise filter and the integrated circuit; and
   wherein the transmission line type noise filter is electrically connected at the first anode terminal thereof to the first power supply line, which is electrically connected to the power supply terminal of the integrated circuit, and wherein the transmission line type noise filter is electrically connected at the second anode terminal thereof to the second power supply line, which is electrically connected to a DC power supply.

2. An electronic circuit as claimed in claim 1, wherein the integrated circuit has an additional power supply terminal, the power supply pattern of the power line layer has an additional first power supply line and an additional second power supply line, and an additional transmission line type noise filter is arranged between the additional first power supply line and the additional second power supply.

3. An electronic circuit as claimed in claim 1, wherein the integrated circuit includes an additional power supply terminal, the first power supply line of the power line layer has a branched power supply line, and the additional power supply terminal of the integrated circuit is connected to the branched power supply line.

4. An electronic circuit as claimed in claim 1, wherein in the transmission line type noise filter:

the anode member comprises a metal fine wire made of the valve-action metal, and a sintered body which is formed on the metal fine wire and is made of the valve-action metal;

the dielectric film is formed on a surface of the sintered body;

the solid electrolyte layer is formed on a surface of the dielectric film;

the conductor layer includes a conductive layer formed on a surface of the solid electrolyte layer;

the first and second anode terminals are connected respective ends of the metal fine wire; and a cathode electrode is connected to the conductor layer.

5. An electronic circuit as claimed in claim 1, wherein in the transmission line type noise filter:

the anode member comprises an aluminum etched foil;

the dielectric film comprises an anode oxidized film formed on a predetermined part of the aluminum etched foil:

the conductive layer comprises a conductive high molecular compound layer formed on the anode oxidized film; and a graphite and silver paste layer is formed on the conductive high molecular compound layer.

6. An electronic circuit as claimed in claim 4, wherein the sintered body is formed by press-molding a powder of the valve-action metal, and then sintering the press-molded powder in a vacuum at a predetermined temperature.

7. An electronic circuit as claimed in claim 4, wherein the sintered body is formed by winding a green sheet, formed from slurry including a powder of the valve-action metal, around the metal fine wire as a core, and then sintering the green sheet wound around the metal fine wire in a vacuum at a predetermined temperature.

* * * * *

UNITED STATES PATENT AND TRADEMARK OFFICE
CERTIFICATE OF CORRECTION

PATENT NO. : 7,061,772 B2  Page 1 of 1
APPLICATION NO. : 10/630481
DATED : June 13, 2006
INVENTOR(S) : Satoshi Arai et al.

It is certified that error appears in the above-identified patent and that said Letters Patent is hereby corrected as shown below:

On the Title page Under Item (56) References Cited:

insert --6,288,889 B1 9/2001 Komatsu et al 361/511--;

On the Title page under OTHER PUBLICATIONS:

change "Kubayashi" to --Kobayashi--.

Signed and Sealed this

Twentieth Day of February, 2007

JON W. DUDAS
*Director of the United States Patent and Trademark Office*